United States Patent
Yun et al.

(10) Patent No.: US 11,353,731 B2
(45) Date of Patent: *Jun. 7, 2022

(54) CURVED DISPLAY MODULE AND DISPLAY APPARATUS HAVING THE SAME

(71) Applicant: SAMSUNG DISPLAY CO., LTD., Yongin-si (KR)

(72) Inventors: Hyoseok Yun, Suwon-si (KR); Min-soo Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/176,656

(22) Filed: Feb. 16, 2021

(65) Prior Publication Data

US 2021/0165265 A1    Jun. 3, 2021

Related U.S. Application Data

(63) Continuation of application No. 16/222,065, filed on Dec. 17, 2018, now Pat. No. 10,948,754.

(30) Foreign Application Priority Data

Dec. 19, 2017   (KR) .......................... 10-2017-0174914

(51) Int. Cl.
   *G02F 1/1333*   (2006.01)
   *G02F 1/1345*   (2006.01)
   (Continued)

(52) U.S. Cl.
   CPC .... *G02F 1/133305* (2013.01); *G02F 1/13452* (2013.01); *G02F 1/13454* (2013.01); *G09G 3/36* (2013.01); *H05K 1/189* (2013.01)

(58) Field of Classification Search
   CPC .. H05K 1/189; G02F 1/13305; G02F 1/13452
   See application file for complete search history.

(56) References Cited

U.S. PATENT DOCUMENTS 9,560,761 B2   1/2017  Kishida et al.
10,108,032 B2  10/2018 Moon et al.
(Continued)

FOREIGN PATENT DOCUMENTS

JP   2015-111209    6/2015
KR   102150069945   6/2015
(Continued)

*Primary Examiner* — Jessica M Merlin
(74) *Attorney, Agent, or Firm* — F. Chau & Associates, LLC

(57) ABSTRACT

A curved display module includes a curved display panel curved with a first curvature in a first direction. A plurality of flexible circuit films are connected to a side portion of the curved display panel. A plurality of driving chips are each mounted on the flexible circuit films. A printed circuit board is connected to the flexible circuit films and is curved with a second curvature in the first direction. Two sides parallel to each other of each of the flexible circuit films are in direct contact with the curved display panel at first and second contact points, respectively, and are in direct contact with the printed circuit board at third and fourth contact points, respectively. A distance between the first and third contact points is different from a distance between the second and fourth contact points.

20 Claims, 9 Drawing Sheets

(51) Int. Cl.
*H05K 1/18* (2006.01)
*G09G 3/36* (2006.01)

(56) References Cited

U.S. PATENT DOCUMENTS

| | | |
|---|---|---|
| 10,948,754 B2 * | 3/2021 | Yun .................... G02F 1/13452 |
| 2014/0085587 A1 | 3/2014 | Liao et al. |
| 2015/0189768 A1 | 7/2015 | Kishida et al. |
| 2015/0316810 A1 | 11/2015 | Shibahara |
| 2015/0373828 A1 | 12/2015 | Ye et al. |
| 2016/0187709 A1 | 6/2016 | Lee et al. |
| 2019/0187506 A1 | 6/2019 | Yun et al. |

FOREIGN PATENT DOCUMENTS

| | | |
|---|---|---|
| KR | 10-2015-0079235 | 7/2015 |
| KR | 10-2017-0058497 | 5/2017 |

* cited by examiner

CURVED DISPLAY MODULE AND DISPLAY APPARATUS HAVING THE SAME

CROSS-REFERENCE TO RELATED APPLICATIONS

This U.S. non provisional patent application is a continuation of U.S. patent application Ser. No. 16/222,065 filed on Dec. 17, 2018, which claims priority under 35 U.S.C. § 119 to Korean Patent Application No. 10-2017-0174914, filed on Dec. 19, 2017, the disclosures of which are incorporated by reference herein in their entireties.

1. Technical Field

Exemplary embodiments of the present invention relate to a curved display module, and more particularly to a display apparatus having the same.

2. Discussion of Related Art

A flat panel display apparatus may include a substrate and a display part disposed on the substrate. The flat panel display apparatus may include a glass substrate. A flexible display apparatus may include a flexible plastic material, and thus the flexible display apparatus may be bendable or foldable.

As an example, a curved display apparatus having a curved shape may give a sense of depth to a screen at which a user is looking. When the curved display apparatus is curved concavely relative to rut observer, an image distortion caused by a viewing angle may be relatively small.

Similar to the flat panel display apparatus, the curved display apparatus may include a display panel, a printed circuit board, and a semiconductor chip package provided in a chip-on-film form to connect the display panel and the printed circuit board. The semiconductor chip package may include a flexible circuit film and a driving chip mounted on the flexible circuit film.

The printed circuit board may be disposed on a rear surface of a receiving member that accommodates the display panel, and in this case, stresses applied to both ends of the flexible circuit film may become different from each other due to a difference in curvature between the display panel and the printed circuit board. A phenomenon in which the driving chip mounted on the flexible circuit film is tilted may occur due to the difference in stress.

SUMMARY

An exemplary embodiment of the present invention provides a curved display module capable of preventing assembling characteristics from deteriorating due to a tilting phenomenon of a driving chip mounted on a flexible circuit film.

An exemplary embodiment of the present invention provides a curved display apparatus including the curved display module.

In an exemplary embodiment of the present invention, a curved display module includes a curved display panel curved with a first curvature in a first direction. A plurality of flexible circuit films are connected to a side portion of the curved display panel. A plurality of driving chips are each mounted on the flexible circuit films. A printed circuit board is connected to the flexible circuit films and is curved with a second curvature in the first direction.

In an exemplary embodiment of the present invention, two sides parallel to each other of each of the flexible circuit films are in direct contact with the curved display panel at first and second contact points, respectively, and are in direct contact with the printed circuit board at third and fourth contact points, respectively. A distance between the first and third contact points is different from a distance between the second and fourth contact points.

In an exemplary embodiment of the present invention, a virtual line passing through a center point of each of the driving chips in a long-axis direction of each of the driving chips is substantially parallel to a tangent at a contact point at which normal line perpendicular to the virtual line at the center point meets the curved display panel.

In an exemplary embodiment of the present invention, the curved display panel is substantially parallel to a second direction crossing the first direction, and when the flexible circuit films are flattened parallel to a flat surface defined by the first direction and the second direction, an angle between a virtual line passing through each of the driving chips in the long-axis direction and a virtual line passing through each of the driving chips in the first direction is greater than 0 degrees and smaller than 90 degrees.

In an exemplary embodiment of the present invention, the angle increases as a distance from a reference line passing through a center of the curved display panel and parallel to the second direction increases in the first direction.

In an exemplary embodiment of the present invention, among the flexible circuit films, a first flexible circuit film is disposed at a first side with respect to the reference line, and a second flexible circuit film is disposed at a second side opposite to the first side with respect to the reference line. When the flexible circuit films are flattened parallel to the flat surface defined by the first direction and the second direction, a first driving chip mounted on the first flexible circuit film among the driving chips is inclined at a first angle with respect to the first direction, and a second driving chip mounted on the second flexible circuit film among the driving chips is inclined with a second angle with respect to the first direction.

In an exemplary embodiment of the present invention, the first angle is defined by an angle between a first virtual line passing through the first driving chip in the long-axis direction and a second virtual line passing through the first driving chip in the first direction, and the second angle is defined by an angle between a third virtual line passing through the second driving chip in the long-axis direction and a fourth virtual line passing through the fourth driving chip in the first direction. Each of the first and second angles is greater than 0 degrees and smaller than 90 degrees.

In an exemplary embodiment of the present invention, the first and second driving chips are tilted symmetrically to each other with respect to the reference line, and the first and second driving chips spaced apart from the reference line by a same distance are tilted with a same angle.

In an exemplary embodiment of the present invention, the printed circuit board includes a first printed circuit board connected to the first flexible circuit film, a second printed circuit board connected to the second flexible circuit film. The first printed circuit board is disposed at the first side with respect to the reference line, and the second printed circuit board is disposed at the second side opposite to the first side with respect to the reference line.

In an exemplary embodiment of the present invention, a curved display apparatus includes a curved display panel curved with a first curvature in a first direction. A first receiving member accommodates the curved display panel.

A plurality of flexible circuit films are connected to a side portion of the curved display panel. A plurality of driving chips are each mounted on a flexible circuit film of the flexible circuit films. A printed circuit board is connected to the flexible circuit films and curved with a second curvature in the first direction.

In an exemplary embodiment of the present invention, two sides parallel to each other of each of the flexible circuit films are in direct contact with the curved display panel at first and second contact points, respectively, and are in direct contact with the printed circuit board at third and fourth contact points, respectively. A distance between the first and third contact points is different from a distance between the second and fourth contact points.

In an exemplary embodiment of the present invention, a virtual line passing through a center point of each of the driving chips in a long-axis direction of each of the driving chips is substantially parallel to a tangent at a contact point at which a normal line substantially perpendicular to the virtual line at the center point meets the curved display panel.

In an exemplary embodiment of the present invention, the curved display panel is substantially parallel to a second direction crossing the first direction, and when the flexible circuit films are flattened parallel to a flat surface defined by the first direction and the second direction, an angle between a virtual line passing through each of the driving chips in the long-axis direction and a virtual line passing through each of the driving chips in the first direction is greater than 0 degrees and smaller than 90 degrees.

In an exemplary embodiment of the present invention, the printed circuit board is disposed on a rear surface of the first receiving member along a curved side of the curved display panel.

In an exemplary embodiment of the present invention, the first receiving member includes a bottom portion having a rectangular shape, curved in the first direction, and parallel to the second direction and sidewall portions extending upward from side surfaces of the bottom portion. The curved display panel is accommodated in a space defined by the bottom portion and the sidewall portions, and the flexible circuit films are bent along an outer side surface of a sidewall portion adjacent to the side portion of the curved display panel among the sidewall portions.

In an exemplary embodiment of the present invention, an upper surface of the curved display panel includes a display area displaying an image and a non-display area surrounding the display area, and the curved display apparatus includes a third receiving member that covers the non-display area of the curved display panel.

In an exemplary embodiment of the present invention, the third receiving member includes a front surface cover portion substantially covering the non-display area and a side surface cover portion extending from the front surface cover portion and disposed to surround the sidewall portions of the first receiving member.

In an exemplary embodiment of the present invention, the third receiving member includes a metal material, the driving chips mounted on the flexible circuit films are disposed between an outer side surface of the sidewall portion and the side surface cover portion, and an inner side surface of the side surface covet portion directly makes contact with an upper surface of the driving chips.

In an exemplary embodiment of the present invention, a display module includes a curved display panel curved along a first direction and having a relatively longer dimension and a relatively shorter dimension. A plurality of flexible circuit films are connected to the curved display panel. A printed circuit board is connected to the flexible circuit films. A plurality of driving chips are each disposed on a flexible circuit film of the flexible circuit films. A first driving chip of the driving chips aligned with a center of the relatively longer dimension of the curved display panel is substantially parallel with the first direction. A second driving chip of the driving chips spaced apart from the center of the relatively longer dimension of the curved display panel is tilted with respect to the first direction. A third driving chip of the driving chips spaced apart from the center of the relatively longer dimension of the curved display panel by a greater distance than that of the second driving chip is tilted with respect to the first direction at a greater angle than that of the second driving chip.

In an exemplary embodiment of the present invention, the driving chips may be previously tilted in anticipation of the stress caused by the curvature difference between the printed circuit board and the curved display panel before the driving chips are mounted on the flexible circuit films. Accordingly, when the stress is applied after the assembling, the driving chips may be aligned along the circumferential direction of the curved display panel, and as a result, an occurrence of defects in the curved display module may be reduced or eliminated. Thus, manufacturing costs may be reduced and manufacturing yield may be increased.

In an exemplary embodiment of the present invention, the driving chips are aligned along the circumferential direction of the curved display panel. As a result, a contact force between the driving chips and the third receiving member (i.e., a top chassis) may be enhanced, and thus heat discharge efficiency of the driving chips may be increased through the top chassis.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION

Figure 1:
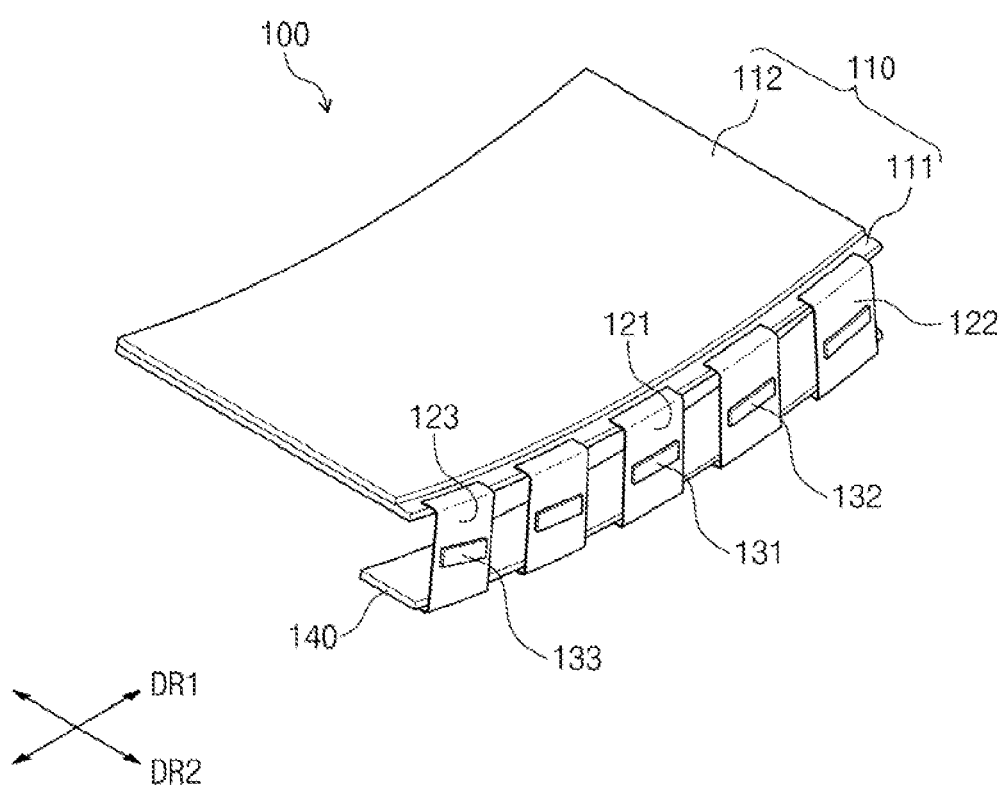
FIG. 1 is a perspective view of a curved display module according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings. Sizes of elements in the drawings may be exaggerated for clarity of description.

It will be understood that when an element or layer is referred to as being "on", "connected to" or "coupled to" another element or layer, it may be directly on, connected or coupled to the other element or layer or intervening elements or layers may be present.

If will be understood that although the terms "first" and "second" may be used herein to describe various components, these components should not be limited by these terms.

FIG. 1 is a perspective view of a curved display module according to an exemplary embodiment of the present invention.

Referring to FIG. 1, a curved display module 100 may include a curved display panel 110, a plurality of flexible circuit films 121, 122, and 123, a plurality of driving chips 131, 132, and 133, and a printed circuit board 140.

The curved display panel 110 may have a shape curved along a first direction DR1 with a first curvature. The curved display panel 110 may have a side substantially parallel to a second direction DR2 perpendicular to the first direction DR1. For example, the curved display panel 110 may have a shape convexly curved downward with respect to a flat surface (e.g., a flat plane) defined by the first direction DR1 and the second direction DR2.

In a case that the curved display panel 110 is flat (e.g., is flattened, such as from the downward convex shape described above), the curved display panel 110 may have a substantially rectangular shape with two relatively longer sides (e.g., extending in the first direction DR1) to face each other and two relatively shorter sides (e.g., extending in the second direction DR2) from both ends of the relatively longer sides to face each other. However, a directional orientation of the curved display panel 110 is not limited to a specific directional orientation and, for example, the relatively shorter side of the curved display panel 110 may extend in the first direction DR1. When a predetermined force is applied to the curved display panel 110 (e.g., when the curved display panel 110 is in a flat state), the curved display panel 110 may be curved with the first curvature with respect to the first direction DR1. The curved display panel 110 may be permanently fixed in a bent or curved stare, or may remain bendable. For example, the curved display panel 110 may be bent into the shape convexly curved downward described above or may be bent into a shape convexly curved upward.

The curved display panel 110 may include a plurality of pixels. The plurality of pixels may display an image. The pixels may be connected to a plurality of gate lines extending in the first direction DR1 and a plurality of data lines extending in the second direction DR2. However, an extending direction of the gate lines or the data lines is not limited to a particular extending direction (e.g., the gate lines may extend in the second direction DR2). The pixels may receive data voltages through the data lines in response to gate signals applied thereto through the gate lines and display grayscales corresponding to the data voltages.

Each pixel may display a primary color. The primary colors may include red, green, and blue colors, but exemplary embodiments of the present invention are not limited thereto or thereby. For example, the primary colors may further include various colors, e.g., a white color, a yellow color, a cyan color, or a magenta color.

The curved display panel 110 may be a liquid crystal display panel including a liquid crystal layer. As an example, the curved display panel 110 may include a first substrate 111 on which the pixels are arranged, a second substrate 112 facing the first substrate 111, and the liquid crystal layer disposed between the first substrate 111 and the second substrate 112. However, according to an exemplary embodiment of the present invention, the curved display panel 110 may be an electrowetting display panel including an electrowetting layer, an electrophoretic display panel including an electrophoretic layer, or an organic light emitting display panel including an organic light, emitting diodes.

The first substrate 111 may have a wider width in at least one direction than the second substrate 112 disposed on the first substrate 111. Thus, at least a portion of an upper surface of the first substrate 111 may be exposed on at least one side of the first substrate. Flexible circuit films (e.g., 121, 122 and 123) described below in more detail may be connected to the exposed upper surface of the first substrate 111.

Each of the flexible circuit films 121, 122, and 123 may include a flexible material. Each of the flexible circuit films 121, 122, and 123 may extend in at least one direction. The flexible circuit films 121, 122, and 123 may be connected to a side of the curved display panel 110 and may be arranged in the first direction DR1. Each of the flexible circuit films 121, 122, and 123 may be spaced apart from each other (e.g., along the first direction), and thus there may be spaces between adjacent flexible circuit films of the flexible circuit films 121, 122, and 123. Each of the flexible circuit films 121, 122, and 123 may include a first end connected to the curved display panel 110 and a second end connected to the printed circuit board 140.

The driving chips 131, 132, and 133 may each be respectively mounted on one of the flexible circuit films 121, 122, and 123. For example, each of the driving chips 131, 132, and 133 may be substantially centered between the first and second ends of a corresponding flexible circuit film of the flexible circuit films 121, 122, and 123 (e.g., along a vertical direction perpendicular to the first and second direction DR1 and DR2).

The printed circuit board 140 may be connected to the second ends of the flexible circuit films 121, 122, and 123. The primed circuit board 140 may apply control signals and image signals to each of the driving chips 131, 132, and 133. As an example, the driving chips 131, 132, and 133 may be data driving chips that generate data voltages. The data driving chips may receive the control signals and the image signals from the printed circuit board 140 to generate the data voltages. The data voltages may be provided to the curved display panel 110 through the first ends of the flexible circuit films 121, 122, and 123 and applied to the pixels through the above-described data lines.

A gate driver may be disposed at a side of the first substrate 111 with respect to the first direction DR1. The gate driver may generate the gate signals, and the gate signals may be applied to the pixels through the above-mentioned gate lines. The gate driver may be substantially simultaneously formed with transistors of the pixels and mounted on the first substrate 111 in an amorphous silicon TFT gate driver circuit (ASG) form or an oxide silicon TFT gate driver circuit (OSG) form.

The printed circuit board 140 may include a controller and a source voltage generator, which are mounted thereon. Accordingly, a control signal generated by the controller and a driving voltage output from the source voltage generator may be applied to the driving chips 131, 132, and 133 through the flexible circuit films 121, 122, and 123.

The printed circuit board 140 may be connected to the second end of the flexible circuit films 121, 122, and 123 and may be curved with a second curvature smaller than the first curvature along the first direction DR1. As an example, the flexible circuit films 121, 122, and 123 having flexibility may be bent, and the printed circuit board 140 connected to the flexible circuit films 121, 122, and 123 may be disposed under the curved display panel 110.

A receiving member that accommodates the curved display panel 110 and/or a backlight unit that provides a light to the curved display panel 110 may be disposed between the printed circuit board 140 and the curved display panel 110. Accordingly, the printed circuit board 140 may be spaced apart from the curved display panel 110 by a predetermined distance without being immediately adjacent to a lower surface of the curved display panel 110 (e.g., the backlight unit may be disposed between the printed circuit board 140 and the curved display panel 110).

The curved display panel 110 has the first curvature, and the printed circuit board 140 has the second curvature. Since the printed circuit board 140 is disposed outside the curved display panel 110 by a distance, a radius of curvature of the printed circuit board 140 may be greater than a radius of curvature of the curved display panel 110. Accordingly, the second curvature may be smaller than the first curvature.

Figure 2:
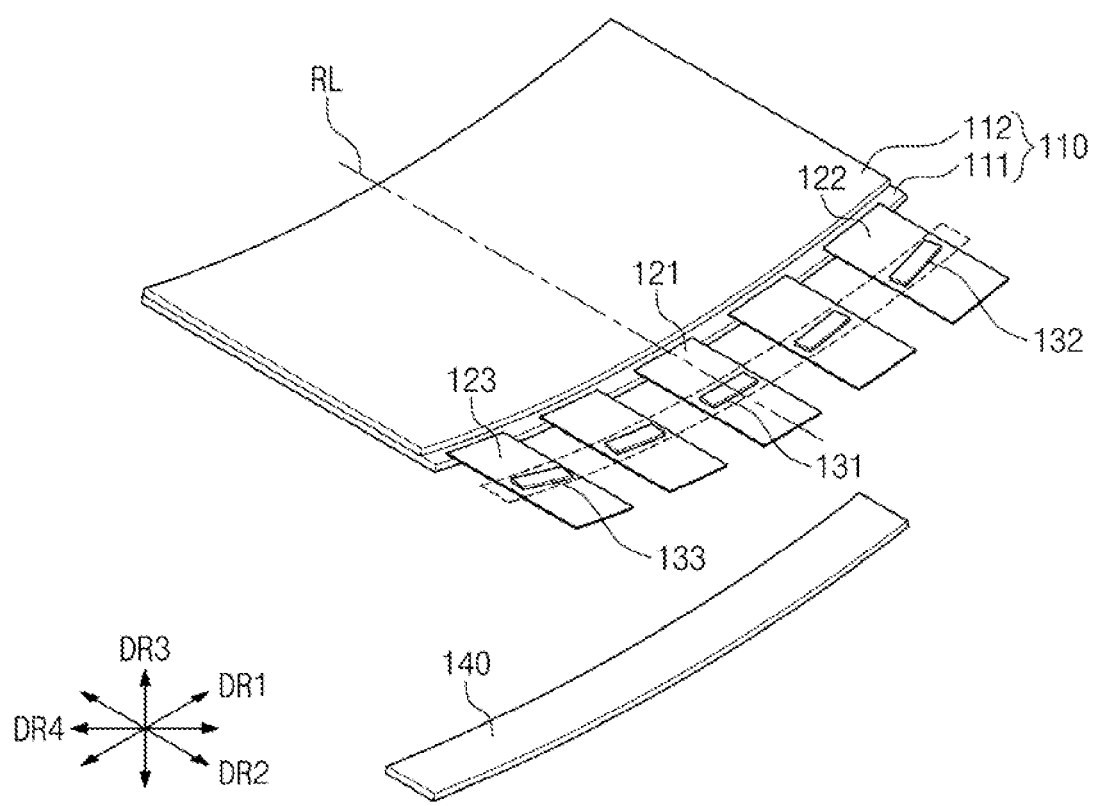
FIG. 2 is a perspective view of a curved display module before flexible circuit films are bent.
Figure 3:
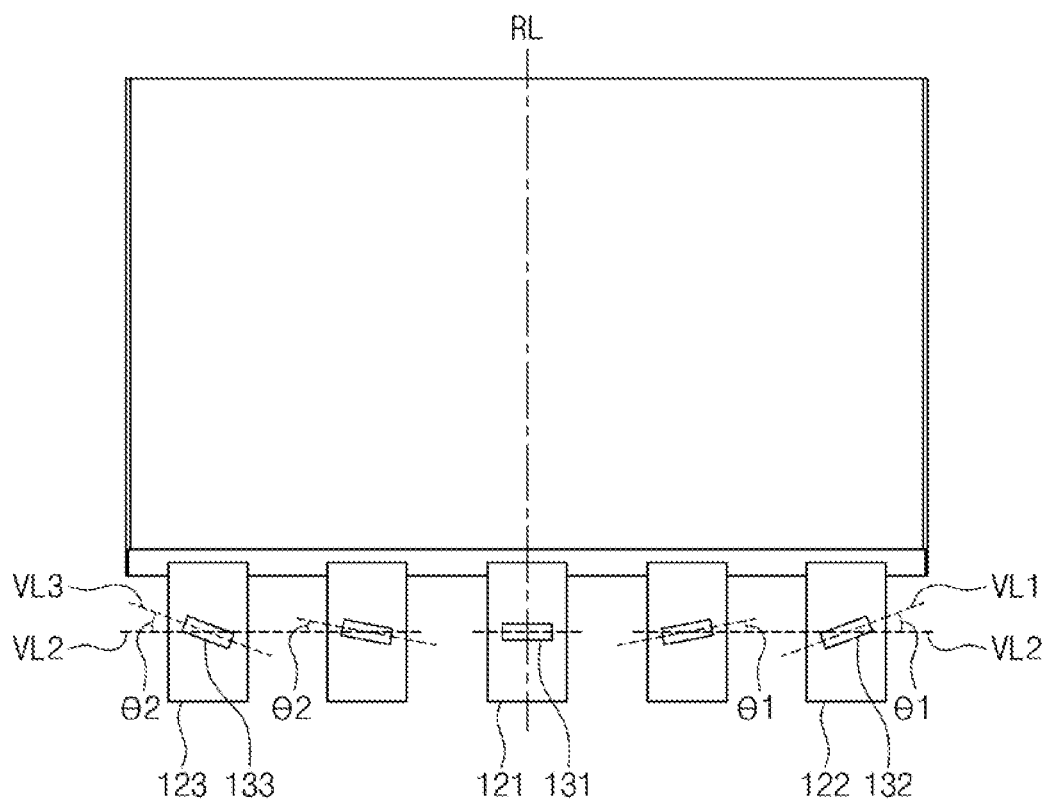
FIG. 3 is a plan view of the curved display module of FIG. 2.
Figure 3:
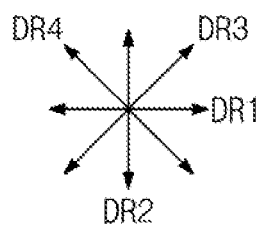

FIG. 2 is a perspective view of a curved display module before flexible circuit films are bent. FIG. 3 is a plan view of the curved display module of FIG. 2.

FIG. 2 is a perspective view of the flexible circuit films 121, 122, and 123 before being bent, and FIG. 3 is a plan view of the curved display module shown in FIG. 2. The printed circuit board 140 is shown separate from the flexible circuit films 121, 122, and 123 in FIGS. 2 and 3 for clarity of description.

Referring to FIGS. 2 and 3, when the flexible circuit films 121, 122, and 123 are flat parallel to the flat surface defined by the first direction DR1 and the second direction DR2, the flexible circuit films 121, 122, and 123 may extend in the second direction DR2 and may be arranged in the first direction DR1. For example, the extension direction of the flexible circuit films 121, 122, and 123 may be entirely parallel with the second direction DR2 when the flexible circuit films 121, 122, and 123 are flat parallel to the flat surface defined by the first direction DR1 and the second direction DR2.

In at least one driving chip among the driving chips 131, 132, and 133 respectively mounted on the flexible circuit films 121, 122, and 123, an angle between a virtual line passing through the driving chip in a long-axis direction (e.g., a direction extending along a relatively longer dimension of a respective driving chip) of the driving chip and a virtual line passing through the driving chip in the first direction DR1 may be greater than 0 degrees and smaller than about 90 degrees. Thus, some of the driving chips 131, 132, and 133 respectively mounted on the flexible circuit films 121, 122, and 123 may be angled or tilted with respect to a relatively longer dimension of the curved display panel 110 (e.g., with respect to a side of the curved display panel 110 in a flat state and extending along the first direction DR1). Thus, when the curved display panel 110 is in a curved state, each of the driving chips (e.g., 131, 132 and 133) may be parallel with a curved extending direction of the curved display panel 110. As a result, a physical stress applied to the driving chips (e.g., 131, 132 and 133) may be reduced, an occurrence of defects in the curved display module 100 may be reduced, and manufacturing yield may be increased.

The angle between the long-axis direction of the driving chips 131, 132, and 133 and the first direction DR1 may be changed depending on positions at which the flexible circuit films 121, 122, and 123 are attached to the curved display panel 110. The angle may increase as a distance from a reference line RL passing through a center axis of the curved display panel 110 increases in the first direction DR1. Thus, outermost chips among the driving chips (e.g., 131, 132 and 133) may have a greater angle with respect to the first direction DR1 when the curved display panel 110 is in a flat state.

As an example, one driving chip among the driving chips 131, 132, and 133 may be disposed on the reference line RL. The driving chip disposed on the reference line RL may be referred to as a "reference driving chip" 131. The long-axis direction of the reference driving chip 131 may be substantially parallel to the first direction DR1. A center of the reference driving chip 131 in the first direction DR1 may be substantially aligned with the reference line RL. Thus, the reference driving chip 131 might not be tilted or angled with respect to the first direction DR1.

The driving chip disposed at a side (e.g., a right side) with respect to the reference line RL among the driving chips 131, 132, and 133 may be referred to as a "first driving chip" 132, and the driving chip disposed at another side (e.g., a left side) with respective to the reference line RL among the driving chips 131, 132, and 133 may be referred to as a "second driving chip" 133.

An angle (which may be referred to as a "first inclination angle θ1") between a first virtual line VL1 passing through the first driving chip 132 in the long-axis direction of the first driving chip 132 and a second virtual line VL2 passing through the first driving chip 132 in the first direction DR1 may be greater than 0 degrees. The first driving chip 132 may be inclined in a third direction DR3 with respect to the first direction DR1. The first driving chip 132 may include two or more first driving chips 132. In this case, the first inclination angle θ1 of the first driving chip 132 may increase as the first driving chip 132 is disposed farther from the reference line RL.

The second driving chip 133 may be disposed at an opposite side of the first driving chip 132 with respect to the reference line RL and inclined in a fourth direction DR4 substantially perpendicular to the third direction DR3. An angle (which may be referred to as a "second inclination angle θ2") between a third virtual line VL3 passing through the second driving chip 133 in the long axis direction of the second driving chip 133 and the second virtual line VL2 passing through the second driving chip 133 in the first direction DR1 may be greater than 0 degrees. The second driving chip 133 may include two or more second driving chips 133. In this case, the second inclination angle θ2 of the second driving chip 133 may increase as the second driving chip 133 is disposed farther from the reference line RL.

As an example, the first and second driving chips 132 and 133 may be arranged to be symmetrical with each other with respect to the reference line RL. For example, the first and second driving chips 132 and 133, which are arranged on the second virtual line VL2 and spaced apart from the reference line RL by the same distance, may be inclined symmetrically with each other with respect to the reference line RL. Accordingly, the first and second inclination angles θ1 and θ2 of the first and second driving chips 132 and 133, width are arranged on the second virtual line VL2 and spaced apart from the reference line RL by substantially the same distance, may be substantially the same as each other.

Figure 4:
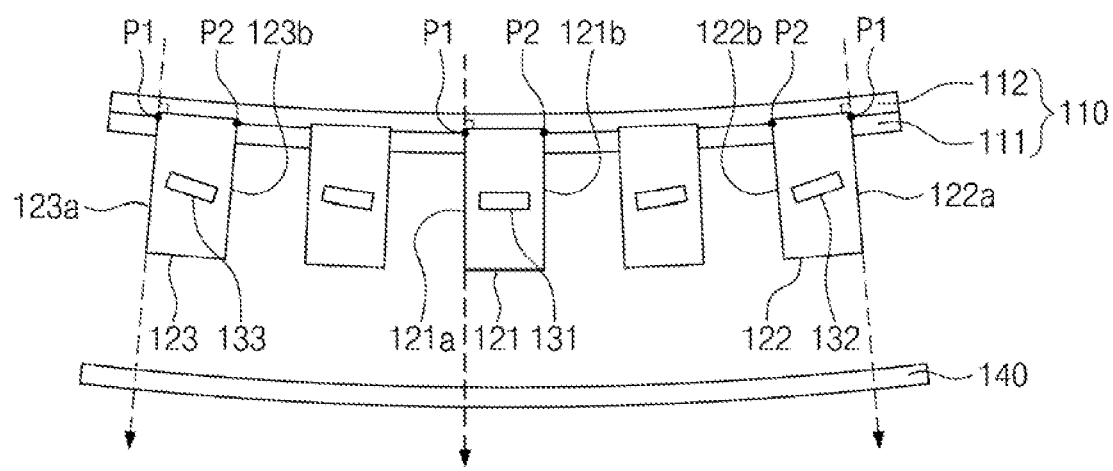
FIG. 4 is a side view of a curved display module before a printed circuit board is attached to the curved display module according to an exemplary embodiment of the present invention.
Figure 5:
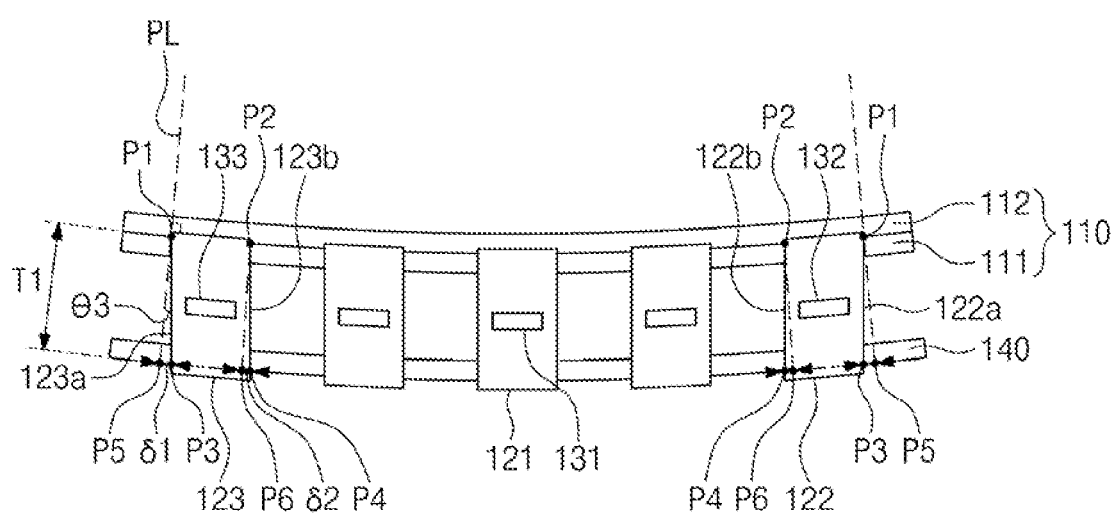
FIG. 5 is a side view of a curved display module after a printed circuit board is attached to the curved display module according to an exemplary embodiment of the present invention.
Figure 6A:
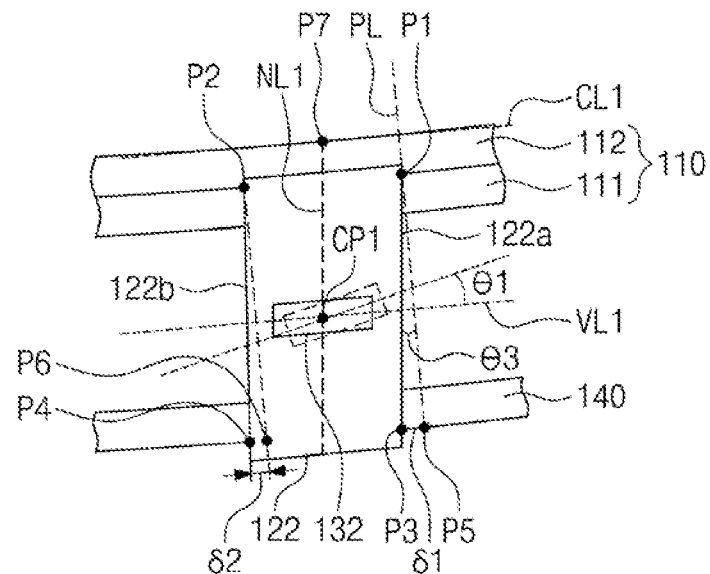
FIG. 6A illustrates a first inclination angle and a third angle of a first driving chip according to an exemplary embodiment of the present invention.
Figure 6B:
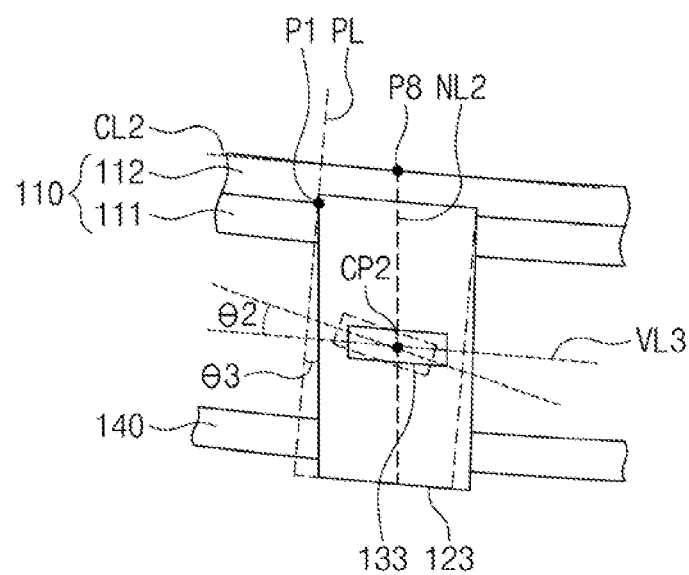
FIG. 6B illustrates a second inclination angle and a third angle of a second driving chip according to an exemplary embodiment of the present invention.

FIG. 4 is a side view of a curved display module before a printed circuit board is attached to the curved display module according to an exemplary embodiment of the present invention. FIG. 5 is a side view of a curved display module after a printed circuit board is attached to the curved display module according to an exemplary embodiment of the present invention. FIG. 6A illustrates a first inclination angle and a third angle of a first driving chip according to an exemplary embodiment of the present invention. FIG. 6B illustrates a second inclination angle and a third angle of a second driving chip according to an exemplary embodiment of the present invention. FIG. 6A illustrates the first inclination angle θ1 and a third angle θ3 of the first driving chip 132, and FIG. 6B illustrates the second inclination angle θ2 and the third angle θ3 of the second driving chip 133.

FIG. 4 illustrates a structure of the flexible circuit films 121, 122, and 123 when the printed circuit board 140 is not attached to the flexible circuit films 121, 122, and 123. Two sides 121a, 121b, 122a, 122b, 123a, and 123b, which are parallel to each other, of each of the flexible circuit films 121, 122, and 123 may be in direct contact with the curved display panel 110 at two contact points P1 and P2. A first side 121a, 122a, and 123a of the two sides may be substantially parallel to a radial direction (e.g., illustrated as a dashed line ending in an arrow in FIG. 4) of the curved display panel 110 at a first contact point P1, and a second side 121b, 122b, and 123b of the two sides may be substantially parallel to the radial direction of the curved display panel 110 at a second contact point P2. The radial direction at the first contact point P1 corresponds to a linear direction vertically passing through the first contact point P1, and the radial direction at the second contact point P2 corresponds to a linear direction vertically passing through the second contact point P2.

Referring to FIG. 5, the printed circuit board 140 may be attached to the flexible circuit films 121, 122, and 123. The two sides 121a, 121b, 122a, 122b, 123a, and 123b, which are parallel to each other, of each of the flexible circuit films 121, 122, and 123 may be in direct contact with the printed circuit board 140 at two contact points P3 and P4.

A stress, which is caused by the difference in curvature between the curved display panel 110 and the printed circuit board 140, may be applied to the flexible circuit films 121, 122, and 123. The stress might not be applied to a reference flexible circuit film 121 on which the reference driving chip 131 is mounted, but applied to the flexible circuit films 122 and 123 on which the first and second driving chips 132 and 133 are respectively mounted. The stress may occur when a display module including the flexible circuit films 121, 122, and 123 is in a bent state. The flexible circuit film on which the first driving chip 132 is mounted may be referred to as a "first flexible circuit film" 122, and the flexible circuit film on which the second driving chip 133 is mounted may be referred to as a "second flexible circuit film" 123. Due to the stress, the first and second sides 122a and 122b of the first flexible circuit film 122 might not be parallel to the normal line direction and may be inclined at a predetermined angle (which may be referred to as the "third angle θ3") with respect to the normal line direction (e.g., along normal line PL). Accordingly, a length of the first and second sides 122a and 122b before the flexible circuit film 122 is assembled to the printed circuit board 140 becomes different from a length of the first and second sides 122a and 122b after the flexible circuit film 122 is assembled to the printed circuit board 140 due to the stress. In addition, since the first side 122a is disposed farther from the reference line RL than the second side 122b, the first side 122a may be more stressed than the second side 122b, and thus the variation of the first side 122a may be greater than the variation of the second side 122b.

Referring to FIGS. 5 and 6A, a contact point at which the first side 122a of the first flexible circuit films 122 is in direct contact with the printed circuit board 140 may be referred to as a "third contact point" P3, and a contact point at which a normal line PL vertically passing through the first contact point P1 makes contact with the printed circuit board 140 may be referred to as a "fifth contact point" P5. A first separation distance δ1 may exist between the third and fifth contact points P3 and P5. The variation of the first side 122a may be defined by a value obtained by subtracting a distance between the first contact point P1 and the third contact point P3 from a distance between the first contact point P1 and the fifth contact point P5.

In addition, a contact point at which the second side 122b of the first flexible circuit films 122 is in direct contact with the printed circuit: board 140 may be referred to as a "fourth contact point" P4, and a contact point at which the normal line PL vertically passing through the second contact point P2 makes contact with the printed circuit board 140 may be referred to as a "sixth contact point" P6. A second separation distance δ2 may exist between the fourth and sixth contact points P4 and P6. The variation of the second side 122b may be defined by a value obtained by subtracting a distance between the second contact point P2 and the fourth contact point P4 from a distance between the second contact point P2 and the sixth contact point P6.

In an exemplary embodiment of the present invention, due to the difference in stress, the first separation distance δ1 may be different from the second separation distance δ2. As an example, the first separation distance δ1 may be greater than the second separation distance δ2. In addition, the variation of the first side 122a may become different from the variation of the second side 122b due to the difference between the first and second separation distances δ1 and δ2. For example, since the first side 122a is relatively more stressed than the second side 122b, the first side 122a may be more elongated than the second side 122b. Accordingly, the length of the first side 122a becomes different from the length of the second side 122b. For example, after the assembling the curved display module 100, a distance between the first contact point P1 and the third contact point P3 becomes different from a distance between the second contact point P2 and the fourth contact point P4.

As an example, the third angle θ3 may be defined by the following Equation.

$$\theta 3 = \tan^{-1} \frac{\delta 1}{T1} \qquad \text{Equation 5}$$

In Equation, T1 denotes a separation distance (which may be referred to as a "third separation distance") between the first contact point P1 and the fifth contact point P5. For example, the third angle θ3 may be determined by the first and third separation distances δ1 and T1.

The third angle θ3 may increase as a distance from the reference driving chip 131 increases. When the third angle θ3 is relatively large the stress applied to the corresponding flexible circuit film may increase due to the difference in curvature. Thus, an amount of stress applied to a flexible circuit film (e.g., 121, 122 or 123) and an amount of stress applied to a driving chip (e.g., 131, 132 or 133) when the curved display module 100 is in a bent state may be proportional to the third angle θ3.

When the stress caused by the difference in curvature between the curved display panel 110 and the printed circuit board 140 is not applied (which may be referred to as an "unapplied state"), the first side 122a of the first flexible circuit film 122 on which the first driving drip 132 is mounted may be in direct contact with the printed circuit board 140 at the fifth contact point P5. In addition, the second side 122b of the first flexible circuit film 122 may be in direct contact with the printed circuit board 140 at the sixth contact point P6 in the unapplied state. For example, the distance between the first contact point P1 and the fifth contact point P5 may be substantially equal to the distance between the second contact point P2 and the sixth contact point P6 in the unapplied state. The unapplied state may exist when the curved display module 100 is in a flat state.

However, when the stress is actually applied (which may be referred to as an "applied state"), the first side 122a of the first flexible circuit film 122 may be in direct contact with the printed circuit board 140 at the third contact point P3. Accordingly, the length of the first side 122a may be lengthened by a difference between a length between the first contact point P1 and the third contact point P3 and a length between the first contact point P1 and the fifth contact point P5. The applied state may exist when the curved display module 100 is in a curved state.

In addition, the second side 122b of the first flexible circuit film 122 may be in direct contact with the printed circuit board 140 at the fourth contact point P4 in the applied state. Accordingly, the length of the second side 122b may be lengthened by a difference between a length between the second contact point P2 and the fourth contact point P4 and a length between the second contact point P2 and the sixth contact point P6.

In this case, since the distance between the fifth contact point P5 and the third contact point P3 may be different from the distance between the fourth contact point P4 and the sixth contact point P6, the distance between the first contact point P1 and the third contact point P3 may become different front the distance between the second contact point P2 and the fourth contact point P4 in the applied state.

In the unapplied state, the long-axis direction of the first driving chip 132 may be inclined at a predetermined angle while passing through the normal line PL of the first contact point P1 without vertically passing through the normal line PL of the first contact point P1. However, the stress is applied to the first driving chip 132 in the applied state, and thus the long-axis direction of the first driving chip 132 may change. As an example, the long-axis direction of the first driving chip 132 may vertically pass through the normal line PL of the first contact point P1 in the applied state.

The long-axis direction of the first driving chip 132 in the unapplied state may be inclined at the first angle θ1 with respect to the long-axis direction of the first driving chip 132 in the applied state. In this case, the first angle θ1 may be equal to the third angle θ3. In the case that the first angle θ1 is equal to the third angle θ3, the long-axis direction of the first driving chip 132 may vertically pass through the normal line PL of the first contact point P1 in the applied state.

When the stress caused by the difference in curvature between the curved display panel 110 and the printed circuit board 140 is not applied, the first side 122a of the first flexible circuit film 122 on which the first driving chip 132 is mounted may be in direct contact with the primed circuit board 140 at the fifth contact point P5 (which may be referred to as an "unapplied state"). However, when the stress is actually applied, the first side 122a of the first flexible circuit film 122 may be in direct contact with the printed circuit board 140 at the third contact point P3 (which may be referred to as an "applied state").

After the printed circuit board 140 is attached to the flexible circuit films 121, 122, and 123, the first virtual line VL1 passing through a center point CP1 of the first driving chip 132 in the long-axis direction may be disposed to be substantially parallel to a tangent CL1 at a contact point P7 at which a normal line NL1 substantially perpendicular to the first virtual line VL1 at the center point CP1 meets the curved display panel 110.

Referring to FIGS. 5 and 6B, in the unapplied state, the long-axis direction of the second driving chip 133 may be inclined at a predetermined angle while passing through the normal line PL of the first contact point P1 without vertically passing through the normal line PL of the first contact point P1. However, when the stress is applied to the second driving chip 133 in the applied state, the long-axis direction of the second driving chip 155 may change.

The long-axis direction of the second driving chip 155 in the unapplied slate may be inclined at the second angle θ2 with respect to the long-axis direction of the second driving chip 133 in the applied state. In this case, the second angle θ2 may be substantially equal to the third angle θ3. In the case that the second angle θ2 is substantially equal to the third angle θ3, the long-axis direction of the second driving chip 133 may vertically pass through the normal line PL of the first contact point P1 in the applied state.

After the printed circuit board 140 is attached to the flexible circuit films 121, 122, and 125, the third virtual line VL3 passing through a center point CP2 of the second driving chip 133 in the long-axis direction may be disposed to be substantially parallel to a tangent CL2 at a contact point P8 at which a normal line NL2 substantially perpendicular to the third virtual line VL3 at the center point CP2 meets the curved display panel 110.

Accordingly, the reference driving chip 131, the first driving chips 132, and the second driving chips 133 may be aligned to be substantially parallel to a circumferential direction of the curved display panel 110. Thus, when the curved display panel 110 is in a curved state, each of the driving chips (e.g., 131, 132 and 133) may be parallel with a curved extending direction of the curved display panel 110. As a result, a physical stress applied to the driving chips (e.g., 131, 132 and 133) may be reduced, an occurrence of defects in the curved display module 100 may be reduced, and manufacturing yield may be increased.

In an exemplary embodiment of the present invention, a display module may include the curved display panel 110 curved along the first direction DR1 and having a relatively longer dimension and a relatively shorter dimension. A plurality of flexible circuit films (e.g., flexible circuit films 121, 122 and 123) may be connected to the curved display panel 110. The printed circuit board (e.g., printed circuit board 140) may be connected to the flexible circuit films. A plurality of driving chips may each be disposed on a flexible circuit film of the flexible circuit films. A first driving chip (e.g., driving chip 131) of the driving chips aligned with a center (e.g., along the reference line RL) of the relatively longer dimension of the curved display panel 110 may be substantially parallel with the first direction DR1. A second driving chip (e.g., driving chip 132) of the driving chips spaced apart from the center of the relatively longer dimension of the curved display panel 110 may be tilted with respect to the first direction DR1. A third driving chip (e.g., driving chip 133) of the driving chips spaced apart from the center of the relatively longer dimension of the curved display panel 110 by a greater distance than that of the second driving chip may be tilted with respect to the first direction DR1 at a greater angle than that of the second driving chip.

Figure 7:
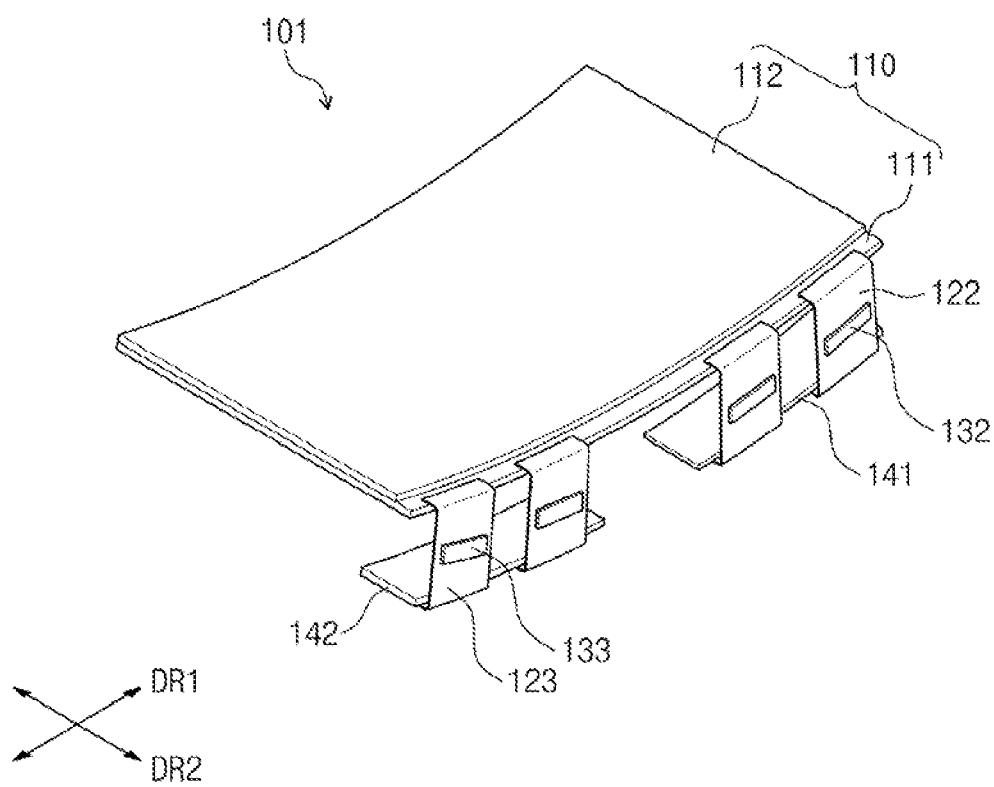
FIG. 7 is a perspective view of a curved display module according to an exemplary embodiment of the present invention.

FIG. 7 is a perspective view of a curved display module according to an exemplary embodiment of the present invention. Referring to FIG. 7 below, descriptions of components that are the same or substantially the same as those described above may be omitted.

Referring to FIG. 7, a curved display module 101 may include first flexible circuit films 122 on which first driving chips 132 are respectively mounted and second flexible circuit films 123 on which second driving chips 133 are respectively mounted. The curved display module 101 may includes a first printed circuit board 141 connected to the first flexible circuit films 122 and a second printed circuit board 142 connected to the second flexible circuit films 123. Thus, the first printed circuit board 141 may be spaced apart from the second printed circuit board 142 (e.g., along the first direction D1) and there may be a space between the flexible printed circuit films 122 connected to the first printed circuit board 141 and the flexible printed circuit films 123 connected to the second printed circuit board 142.

As an example, the curved display module 100 may include one printed circuit board 140, and the curved display module 101 described with reference to FIG. 7 may include two printed circuit boards 141 and 142. However, exemplary embodiments of the present invention are not limited thereto. As an example, the curved display module may include a separate printed circuit board for each flexible circuit film. Thus, the number of flexible circuit films may be the same as the number of printed circuit boards, and each circuit board may be connected with one flexible circuit film.

Referring to FIG. 7, when the curved display module 101 includes two printed circuit boards 141 and 142, the reference flexible circuit film 121 and the reference driving chip 131 described with reference to FIG. 1 may be omitted. As another example, the curved display module may further include a separate printed circuit board connected to the reference flexible circuit film 121.

The curved display panel 101 may be permanently fixed in a bent or curved state, or may remain bendable. For example, the curved display panel 101 may be bent into the shape convexly curved downward described above or may be bent into a shape convexly curved upward.

Figure 8:
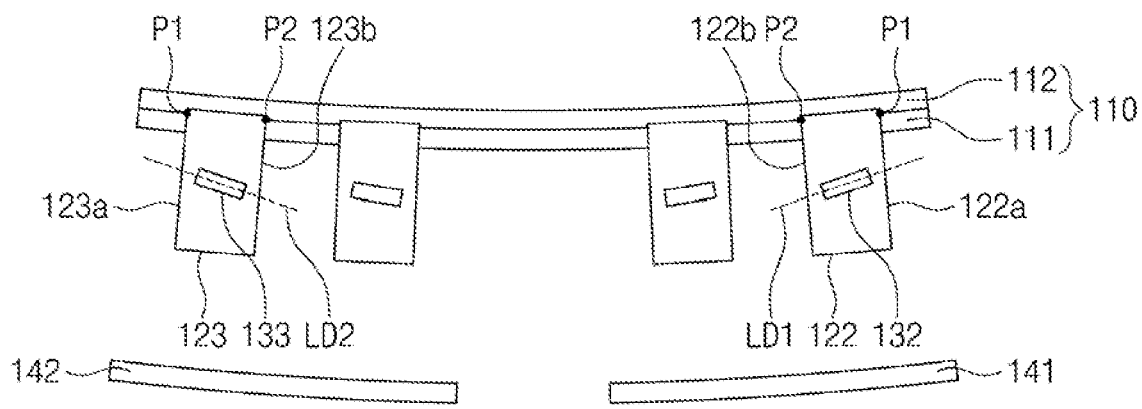
FIG. 8 is a side view of a curved display module before a printed circuit board is attached to the curved display module according to an exemplary embodiment of the present invention.
Figure 9:
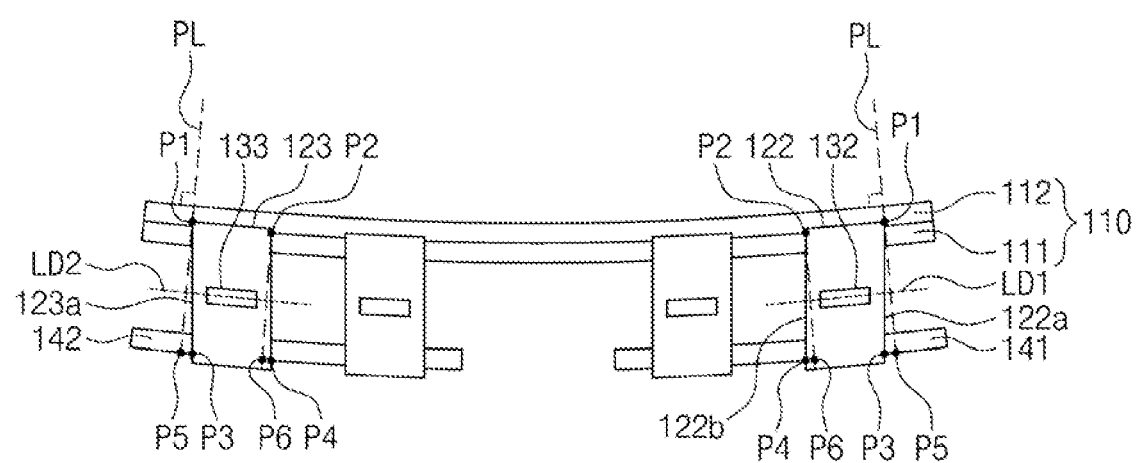
FIG. 9 is a side view of a curved display module after a printed circuit board is attached to the curved display module according to an exemplary embodiment of the present invention.

FIG. 8 is a side view of a curved display module before a printed circuit board is attached to the curved display module according to an exemplary embodiment of the present invention. FIG. 9 is a side view of a curved display module after a printed circuit board is attached to the curved display module according to an exemplary embodiment of the present invention.

FIG. 8 illustrates the first and second flexible circuit films 122 and 123 that are bent before the first and second printed circuit boards 141 and 142 are attached to the first and second flexible circuit films 122 and 123.

Two sides 122a and 122b, which are substantially parallel to each other, of the first flexible circuit films 122 may be in direct contact with the curved display panel 110 at first and second contact points P1 and P2, respectively. A first side 122a may be substantially parallel to a radial direction of the curved display panel 110 at the first contact point P1, and a second side 122b may be substantially parallel to the radial direction of the curved display panel 110 at the second contact point P2.

Two sides 123a and 123b, which are substantially parallel to each other, of the second flexible circuit films 123 may be in direct contact with the curved display panel 110 at the first and second contact points P1 and P2, respectively. A first side 123a may be substantially parallel to the radial direction of the curved display panel 110 at the first contact point P1, and a second side 123b may be substantially parallel to the radial direction of the curved display panel 110 at the second contact point P2.

In an exemplary embodiment of the present invention, the radial direction at the first contact point P1 corresponds to a normal line direction vertically passing through the first contact point P1, and the radial direction at the second contact point P2 corresponds to a normal line direction vertically passing through the second contact point P2.

Referring to FIG. 9, when the first printed circuit board 141 is attached to the first flexible circuit films 122, a stress may be applied to the first flexible circuit films 122 due to a difference in curvature between the curved display panel 110 and the first printed circuit board 141. In addition, the stress may be applied to the first driving chip 132 mounted on the first flexible circuit film 122. Accordingly, the first side 122a of the first flexible circuit films 122 may be inclined at a third angle θ3 with respect to the normal line direction.

Referring to FIG. 9, a contact point at which the first side 122a of the first flexible circuit films 122 is in direct contact with the first printed circuit board 141 may be referred to as a third contact point P3, and a contact point at which a normal line PL, vertically passing through the first contact point P1 is in direct contact with the first printed circuit board 141 may be referred to as a fifth contact point P5. A first separation distance δ1 exists between the third and fifth contact points P3 and P5. A variation of the first side 122a may be defined by a value obtained by subtracting a distance between the first contact point P1 and the third contact point P3 from a distance between the first contact point P1 and the fifth contact point P5.

In addition, a contact point at which the second side 122b of the first flexible circuit films 122 is in direct contact with the first printed circuit board 141 may be referred to as a "fourth contact point" P4, and a contact point at which a normal line PL vertically passing through the second contact point P2 makes contact with the first printed circuit board 141 will be referred to as a "sixth contact point" P6. A second separation distance δ2 exists between the fourth and sixth contact points P4 and P6. A variation of the second side 122*b* may be defined by a value obtained by subtracting a distance between the second contact point P2 and the fourth contact point P4 from a distance between the second contact point P2 and the sixth contact point P6.

In an exemplary embodiment of the present invention, due to the difference in stress, the first separation distance δ1 may be different from the second separation distance δ2. As an example, the first separation distance δ1 may be greater than the second separation distance δ2. In addition, the variation of the first side 122*a* may become different from the variation of the second side 122*b* due to the difference between the first and second separation distances δ1 and δ2. For example, since the first side 122*a* may be relatively more stressed than the second side 122*b*, the first side 122*a* may be more elongated than the second side 122*b*. Accordingly, the length of the first side 122*a* becomes different from the length of the second side 122*b*. For example, after assembling the curved display module 101, the distance between the first contact point P1 and the third contact point P3 may become different from the distance between the second contact point P2 and the fourth contact point P4.

Referring to FIGS. 8 and 9, the first driving chip 132 may be inclined at a predetermined angle without being perpendicular to the normal line PL in the stress-unapplied state. Then, when the first flexible circuit films 122 am connected to the first printed circuit board 141, stress may be applied to the first driving chip 132, and as a result, a long-axis direction LD1 of die first driving chip 132 may change. For example, an angle of the first driving chip 132 with respect to the curved display panel 110 may change as the curved display panel 110 is bent or curved.

Accordingly, the long-axis direction LD1 of the first driving chip 132 in the stress-unapplied state may be inclined at a first angle (e.g., the first inclination angle θ1—see, e.g., FIG. 6A) with respect to the long-axis direction LD1 of the first driving chip 132 in the stress-applied state. The first angle θ1 may be substantially equal to the third angle θ3.

Referring to FIG. 9 again, when the second printed circuit board 142 is attached to the second flexible circuit films 123, stress may be applied to the second flexible circuit films 123 due to a difference in curvature between the curved display panel 110 and the second printed circuit board 142. In addition, stress may be applied to the second driving chip 133 mounted on the second flexible circuit film 123. Accordingly, the first side of the second flexible circuit films 123 may be inclined at the third angle θ3 with respect to the normal line direction.

Referring to FIGS. 8 and 9, in the stress-unapplied stare, the second driving chip 133 may be inclined at a predetermined angle with respect to the normal line PL without being perpendicular to the normal line PL. Then, when the second flexible circuit film 133 is connected to the second printed circuit board 142, stress may be applied to the second driving chip 133, and thus a long-axis direction LD2 of the second driving chip 133 may be charged.

Accordingly, the long-axis direction LD2 of the second driving chip 133 in the stress-unapplied state may be inclined at the second angle θ2 (see, e.g., FIG. 6B) with respect to the long-axis direction LD2 of the second driving chip 133 in the stress-applied state. In this case, the second angle θ2 may be substantially equal to the third angle θ3.

Therefore, when the first and second flexible circuit films 122 and 123 are respectively connected to the first and second printed circuit boards 141 and 142, the first and second driving chips 132 and 133 may be aligned along a circumferential direction of the curved display panel 110.

Thus, the driving chips 132, and 133 respectively mounted on the flexible circuit films 122, and 123 may be angled or tilted with respect to a relatively longer dimension of the curved display panel 110 (e.g., with respect to a side of the curved display panel 110 in a flat state and extending along the first direction DR1). Thus, when the curved display panel 110 is in a curved state (e.g., after the first and second printed circuit boards 141 and 142 are attached to the flexible circuit films 122, and 123, respectively), each of the driving chips (e.g., 132 and 133) may be parallel with a curved extending direction of the curved display panel 110. As a result, a physical stress applied to the driving chips (e.g., 132 and 133) may be reduced, an occurrence of defects in the curved display module 101 may be reduced, and manufacturing yield may be increased.

Referring to FIGS. 1-5, 6A, 6B, 8 and 9, the first and second driving chips 132 and 133 may be tilted in advance in anticipation of a stress caused by the difference in curvature (e.g., a difference in curvature between the curved display panel 110 and the printed circuit board 140 or between the curved display panel 110 and the first and second printed circuit boards 141 and 142). Accordingly, when stress is applied after assembling a display module according to an exemplary embodiment of the present invention, the first and second driving chips 132 and 133 may be aligned along the circumferential direction of the curved display panel 110, and as a result, an occurrence of defects in the curved display module 100 and 101 may be reduced or eliminated. Thus, manufacturing costs may be reduced, and manufacturing yield may be increased.

Figure 10:
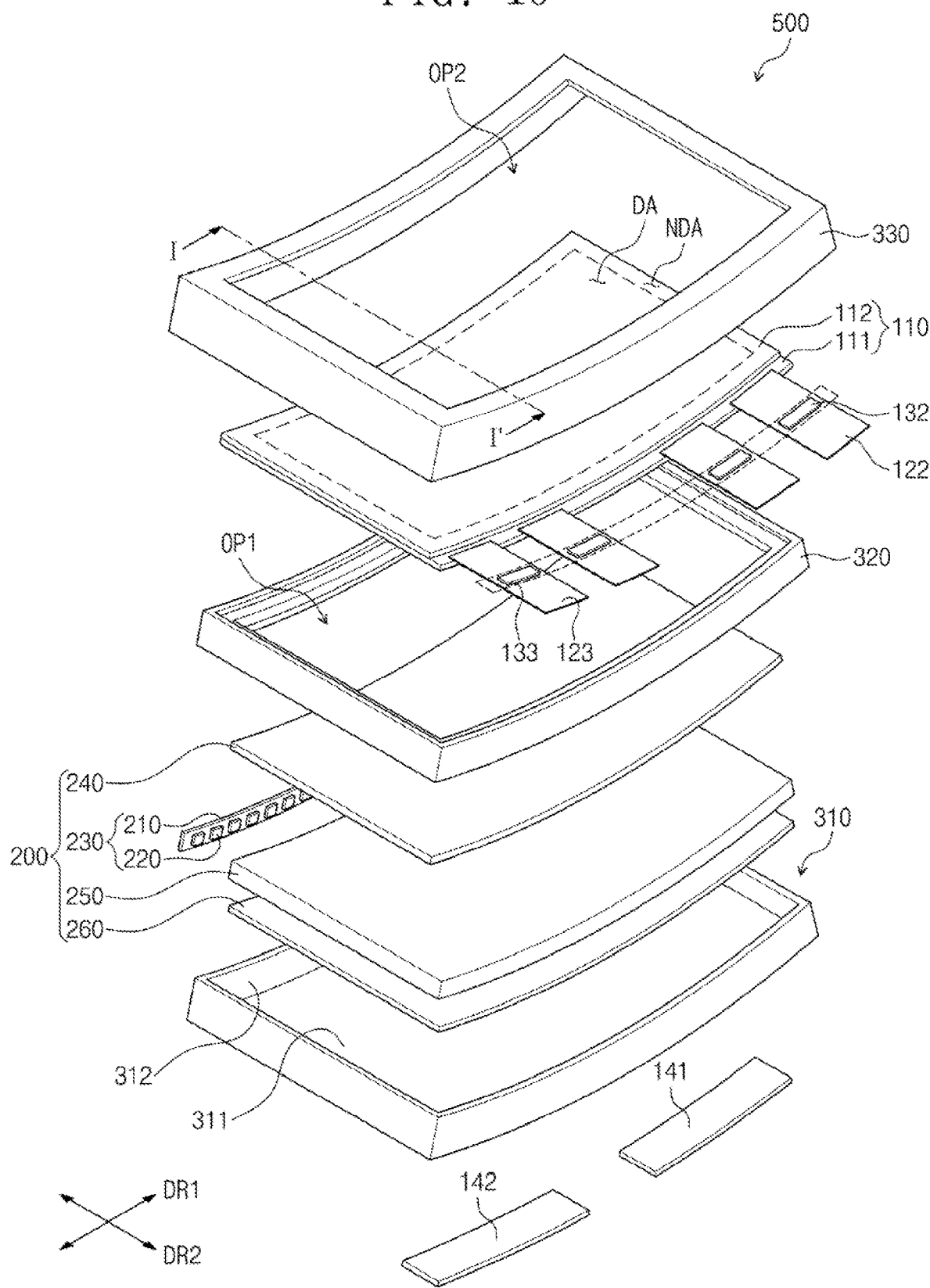
FIG. 10 is a perspective view of a curved display apparatus according to an exemplary embodiment of the present invention.
Figure 11:
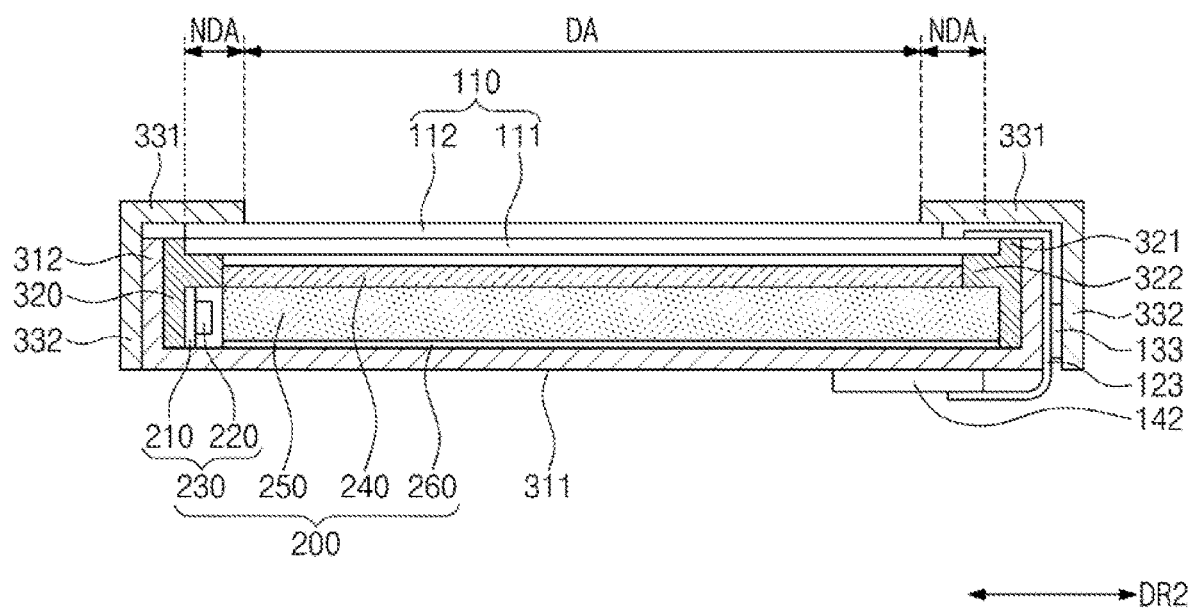
FIG. 11 is a cross-sectional view of the curved display apparatus taken along a line I-I' of FIG. 10.

FIG. 10 is a perspective view of a curved display apparatus according to an exemplary embodiment of the present invention. FIG. 11 is a cross-sectional view of the curved display apparatus taken along a line I-I' of FIG. 10.

Referring to FIGS. 10 and 11, a curved display apparatus 500 may have a shape curved in the first direction DR1 and a side of the curved display apparatus 500 may be parallel to the second direction DR2 crossing the first direction DR1.

The curved display apparatus 500 may include the curved display panel 110, a backlight unit 200 generating a light and providing the light to the curved display panel 110, and receiving members 310, 320, and 330 accommodating the curved display panel 110 and the backlight unit 200. The backlight unit 200 may be disposed behind the curved display panel 110 and may provide light to the curved display panel 110.

The curved display panel 110 may include a display area DA displaying an image and a non-display area NDA around the display area DA. The non display area NDA may be disposed on four sides of the display area DA in a plan view. Alternatively, the non-display area NDA may be disposed on fewer than four sides (e.g., on one side) of the display area DA in a plan view.

The curved display apparatus 500 may include first and second flexible circuit films 122 and 125 connected to the curved display panel 110 and first and second driving chips 132 and 133 respectively mounted on the first and second flexible circuit films 122 and 123. The curved display apparatus 500 may include the first printed circuit board 141 connected to the first flexible circuit film 122 and the second printed circuit board 142 connected to the second flexible circuit film 123. The first and second flexible circuit films 122 and 123, the first and second driving chips 132 and 133, and the first and second printed circuit boards 141 and 142 may have the same structure and function as those described above, and rims duplicative descriptions may be omitted below.

As an example, the backlight unit 200 may be an edge-type backlight unit; however, exemplary embodiments of the present invention are not limited thereto. The backlight unit 200 may include an optical sheet 240, a light guide plate 250, a light source 230, and a reflection sheet 260. The optical sheet 240, the light guide plate 250, the light source 230, and the reflection sheet 260 may be curved in the first direction DR1 and may have a side substantially parallel to the second direction DR2. For example, the optical sheet 240, the light guide plate 250, the light source 230, and the reflection sheet 260 may be curved in the first direction DR1 to have substantially a same curved shape as the curved display panel 110.

The light guide plate 250 may have a rectangular shape defined including two relatively longer sides extending in the first direction DR1 to face each other in the second direction DR2 and two relatively shorter sides extending in the second direction DR2 from both ends of the long sides to face each other in rhea first direction DR1. However, exemplary embodiments of the present invention are not limited thereto, and the light guide plate 50 may have a different shape, or may have a rectangular shape including relatively longer sides extending in the second direction DR2. The light source 230 may be disposed adjacent to a first side of the light guide plate 250 in the second direction DR2. The first and second printed circuit boards 141 and 142 may be disposed adjacent to a (e.g., an opposite) second side of the light guide plate 250 in the second direction DR2.

The first side of the light guide plate 250 in the second direction DR2 may be one of the relatively longer sides of the light guide plate 50, and the second side of the light guide plate 250 in the second direction DR2 may be a second relatively longer side of the light guide plate 50. In an exemplary embodiment of the present invention, the light source 230 may be disposed adjacent to the first side of the light guide plate 250, but the position of the light source 230 is not limited thereto or thereby (e.g., the light source 230 may be adjacent to the second side of the light guide plate 250. For example, the light source 230 may be disposed adjacent to a relatively shorter side of two relatively shorter sides of the light guide plate 250. As an example, the light source 230 may be disposed adjacent to a side surface among side surfaces, to which the first and second printed circuit boards 141 and 142 are disposed not to be adjacent, of the light guide plate 230.

The reflection sheet 260 may be disposed under the light guide plate 250, and the optical sheet 240 may be disposed on the light guide plate 250. The curved display panel 110 may be disposed above the optical sheet 240.

The light source 230 may generate light and may emit the light to the curved display panel 110. The light generated by the light source 230 may be provided to one side of the light guide plate 250 in the second direction DR2. The one side of the light guide plate 250 may be referred to as a light incident portion. The light guide plate 250 may change a direction in which the light provided from the light source 230 travels to allow the light to travel in an upward direction where the curved display panel 110 is disposed.

The light source 230 may include a light source substrate 210 curved with a first curvature in the first direction DR1 and a plurality of light emitting diodes 220 mounted on the light source substrate 210. The light emitting diodes 220 may be arranged at regular intervals in the first direction DR1. The light emitting diodes 220 may be disposed to face one side surface of the light guide plate 250 in the second direction DR2. The light emitting diodes 220 may generate light, and the light generated by the light emitting diodes 220 may be provided to the one side surface of the light guide plate 250.

The reflection sheet 260 may reflect light leaking downward from the light guide plate 250 in an upward direction (e.g., opposite the downward direction). The optical sheet 240 may include a diffusion sheet and a prism sheet disposed on the diffusion sheet. The diffusion sheet may diffuse light provided from the light guide plate 250. The prism sheet may condense light diffused by the diffusion sheet in the upward direction substantially vertical (e.g., orthogonal to) with respect to the flat surface defined by the first direction DR1 and the second direction DR2. The light exiting from the prism sheet may travel in the upward direction and may be provided to the curved display panel 110 with a substantially uniform brightness distribution.

The receiving members 310, 320, and 330 may include a first receiving member 310 accommodating the backlight unit 200 and the curved display panel 110, a second receiving member 320 supporting the curved display panel 110, and a third receiving member 330 covering the non-display area NDA of the curved display panel 110. As an example, the first receiving member 310, the second receiving member 320, and the third receiving member 330 may be referred to as a bottom chassis, a mold frame, and a top chassis, respectively. The first, second, and third receiving members 310, 320, and 330 may be curved with the first curvature in the first direction DR1 and may each include a side substantially parallel to the second direction DR2.

The first receiving member 310 may include a bottom portion 311 curved with the first curvature in the first direction DR1 and substantially parallel to the second direction DR2 and sidewall portions 312 extending upward from side surfaces of the bottom portion 311. The bottom portion 311 may form a lower surface of the first receiving member 310, and the sidewall portions 312 may form side surfaces of the first receiving member 310.

The bottom portion 311 may have a rectangular shape with a relatively longer side in the first direction DR1 and a relatively shorter side in the second direction DR2. The bottom portion 311 may be convexly curved downward with respect to the flat surface defined by the first direction DR1 and the second direction DR2. The backlight unit 200 and the curved display panel 110 may be accommodated in a space defined by the bottom portion 311 and the sidewall portions 312.

The second receiving member 320 may be disposed between the curved display panel 110 and the backlight unit 200 and may have a rectangular frame shape. The second receiving member 320 may be disposed to correspond to the non-display area NDA of the curved display panel 110 and to support an edge portion of the curved display panel 110. The edge portion of the curved display panel 110 may correspond to a border area of the curved display panel 110, for example, a predetermined area of the non-display area NDA of the curved display panel 110. A first opening OP1 may be defined through the second receiving member 320 to expose the display area DA of the curved display panel 110.

The third receiving member 330 may have a rectangular frame shape, and a second opening OP2 may be defined through the third receiving member 330 to expose the display area DA of the curved display panel 110. The third receiving member 330 may substantially cover the non-display area NDA of the curved display panel 110.

When the curved display apparatus 500 is assembled, the first and second flexible circuit films 122 and 123 having flexibility may be bent, and the first and second printed circuit boards 141 and 142 respectively connected to the first and second flexible circuit films 122 and 123 may be disposed under the curved display panel 110. The first and second printed circuit boards 141 and 142 may be disposed on a rear surface of the bottom portion 311 of the first receiving member 310. The curved display apparatus 500 may be in a permanently curved or bent state or may remain bendable.

Referring to FIG. 11, the backlight unit 200 and the curved display panel 110 may be accommodated in the first receiving member 310. The reflection sheet 260, the light guide plate 250, the optical sheet 240, and the curved display panel 110 may be accommodated in the first receiving member 310.

The sidewall portions 312 of the first receiving member 310 may be disposed to surround a border of the second receiving member 320. The second receiving member 320 may include a first supporter 321 disposed on inner side surfaces of the sidewall portions 312 and a second supporter 322 extending from a predetermined area of an inner side surface of the first supporter 321 to be vertical with respect to the first supporter 321.

When the edge portion of the curved display panel 110 is disposed on the second supporter 322, the curved display panel 110 may be supported by the second receiving member 320. For example, the first substrate 111 may be disposed on the second supporter 322, and a side surface of the first substrate 111 may be disposed above the second supporter 322 to be adjacent to the inner side surface of the first supporter 321. As a result, the curved display panel 110 may be guided by the first supporter 321, and the curved display panel 110 may be prevented from moving (e.g., may be fixedly secured in a desired position).

A second substrate 112 of the curved display panel 110 may allow a lower surface of the second substrate 112 to be aligned with an upper surface of the second receiving member 320 or may be disposed above the second receiving member 320. The first substrate 111 may extend longer than the second substrate 112 in the second direction DR2 (e.g., at one side of the second substrate 112). The first and second flexible circuit films 122 and 123 may be connected to one side portion of the first substrate 111, which does not overlap with the second substrate 112.

The first and second flexible circuit films 122 and 123 may be bent along the upper surface of the second receiving member 320 adjacent to the sidewall portion 312 and an outer side surface of the sidewall portion 312 may be bent to a lower side of the bottom portion 311 adjacent to the sidewall portion 312. When the first flexible circuit films 122 are bent, the first printed circuit board 141 connected to the first flexible circuit films 122 may be disposed below the bottom portion 311 of the first receiving member 310. When the second flexible circuit films 123 are bent, the second printed circuit board 143 connected to the second flexible circuit films 123 may be disposed below the bottom portion 311 of the first receiving member 310.

The third receiving member 330 may include a front surface cover portion 331 covering the non-display area NDA of the curved display panel 110 and a side surface cover portion 332 extending from the front surface cover portion 331 and disposed to at least partially surround the sidewall portions 312 of the first receiving member 310. As an example, the first and third receiving members 310 and 330 may each include a metal material.

When the first and second flexible circuit films 122 and 123 are bent along the outer side surface of the sidewall portion 312, the first and second driving chips 132 and 133 respectively mounted on the first and second flexible circuit films 122 and 123 may be disposed between the outer side surface of the sidewall portion 312 and the side surface cover portion 332. The inner side surface of the side surface cover portion 332 may directly make contact with the upper surface of the first and second driving chips 122 and 123.

As described, the first and second driving chips 122 and 123 may be aligned along the circumferential direction of the curved display panel 110 after being assembled. Accordingly, the first and second driving chips 122 and 123 may be prevented from being tilted beyond the circumferential direction due to the stress caused by the curvature difference. As a result, a contact force between the first and second driving chips 122 and 123 and the third receiving member 330 (e.g., the top chassis) may be increased, and thus heat discharge efficiency of the first and second driving chips 122 and 123 may be increased through the third receiving member 330.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A curved display module comprising:
a curved display panel curved with a first curvature in a first direction;
a plurality of flexible circuit films connected to a side portion of the curved display panel;
a plurality of driving chips each mounted on a flexible circuit film of the flexible circuit films, wherein at least one driving chip of the plurality of driving chips is mounted on at least one flexible circuit film of the plurality of flexible circuit films with a tilt with respect to the first direction; and
a printed circuit board connected to the plurality flexible circuit films and curved with a second curvature in the first direction,
wherein a virtual line passing through a center point of the at least one driving chip in a long-axis direction thereof is inclined with respect to the first direction.

2. The curved display module of claim 1, wherein the curved display panel is substantially parallel to a second direction crossing the first direction, and an angle between a virtual line passing through the at least one driving chip in the long-axis direction and a virtual line passing through the at least one driving chip in the first direction is greater than about 0 degrees and smaller than about 90 degrees.

3. The curved display module of claim 2, wherein the angle increases as a distance from a reference line passing through a center of the curved display panel and parallel to the second direction increases in the first direction.

4. The curved display module of claim 3, wherein a first flexible circuit film among the flexible circuit films is disposed at a first side with respect to the reference line, a second flexible circuit film among the flexible circuit films is disposed at a second side opposite to the first side with respect to the reference line, and a first driving chip mounted on the first flexible circuit film among the driving chips is inclined with a first angle with respect to the first direction and a second driving chip mounted on the second flexible circuit film among the driving chips is inclined with a second angle with respect to the first direction.

5. The curved display module of claim 4, wherein the first angle is defined by an angle between a first virtual line passing through the first driving chip in the long-axis direction and a second virtual line passing through the first driving chip in the first direction, the second angle is defined by an angle between a third virtual line passing through the second driving chip in the long-axis direction and a fourth virtual line passing through the second driving chip in the first direction, and each of the first and second angles is greater than about 0 degrees and smaller than about 90 degrees.

6. The curved display module of claim 4, wherein the first and second driving chips are tilted symmetrically to each other with respect to the reference line, and the first and second driving chips spaced apart from the reference line by a same distance are tilted with a same angle.

7. The curved display module of claim 4, wherein the printed circuit board comprises:
a first printed circuit board connected to the first flexible circuit film; and
a second printed circuit board connected to the second flexible circuit film.

8. The curved display module of claim 7, wherein the first printed circuit board is disposed at the first side with respect to the reference line, and the second printed circuit board is disposed at the second side opposite to the first side with respect to the reference line.

9. The curved display module of claim 2, wherein, when a contact point at which a first side of the flexible circuit film makes contact with the curved display panel is referred to as a first contact point, an angle ($\theta$) is equal to an angle between a normal line vertically passing through the first contact point and the first side of the flexible circuit film.

10. The curved display module of claim 9, wherein, when a contact point at which the first side makes contact with the printed circuit board is referred to as a third contact point and a contact point at which the normal line makes contact with the printed circuit board is referred to as a fifth contact point, the angle ($\theta$) satisfies the following Equation of $$\theta = \tan^{-1}\frac{\delta 1}{T1}$$

, wherein the "$\delta 1$" denotes a separation distance between the third contact point and the fifth contact point, and the "T1" denotes a separation distance between the first contact point and the fifth contact point.

11. The curved display module of claim 1, wherein the second curvature is smaller than the first curvature.

12. A curved display apparatus comprising:
a curved display panel curved with a first curvature in a first direction;
a first receiving member accommodating the curved display panel;
a plurality of flexible circuit films connected to a side portion of the curved display panel;
a plurality of driving chips each mounted on a flexible circuit film of the flexible circuit films, wherein at least one driving chip of the plurality of driving chips is mounted on at least one flexible circuit film of the plurality of flexible circuit films with a tilt with respect to the first direction; and
a printed circuit board connected to the plurality of flexible circuit films and curved with a second curvature in the first direction, wherein a virtual line passing through a center point of the at least one driving chip in a long-axis direction thereof is inclined with respect to the first direction.

13. The curved display apparatus of claim 12, wherein the curved display panel is substantially parallel to a second direction crossing the first direction, and an angle between a virtual line passing through the at least one driving chip of the driving chips in the long-axis direction and a virtual line passing through the at least one driving chip in the first direction is greater than about 0 degrees and smaller than about 90 degrees.

14. The curved display apparatus of claim 13, wherein the primed circuit board is disposed on a rear surface of the first receiving member along a curved side of the curved display panel.

15. The curved display apparatus of claim 14, wherein the first receiving member comprises;
a bottom portion having a rectangular shape, curved in the first direction, and parallel to the second direction; and
sidewall portions extending upward from side surfaces of the bottom portion, wherein the curved display panel is accommodated in a space defined by the bottom portion and the sidewall portions, and the flexible circuit films are bent along an outer side surface of a sidewall portion adjacent to the side portion of the curved display panel among the sidewall portions.

16. The curved display apparatus of claim 15, further comprising:
a backlight unit disposed under the curved display panel, accommodated in the first receiving member; and
a second receiving member supporting art edge portion of the curved display panel.

17. The curved display apparatus of claim 15, further comprising a third receiving member, wherein an upper surface of the curved display panel comprises a display area displaying an image and a non-display area surrounding the display area, and the third receiving member substantially covers the non-display area of the curved display panel.

18. The curved display apparatus of claim 17, wherein the third receiving member comprises:
a front surface cover portion covering the non-display area; and
a side surface cover portion extending from the front surface cover portion and disposed to surround the sidewall portions of the first receiving member.

19. The curved display apparatus of claim 18, wherein the third receiving member comprises a metal material, the driving chips mounted on the flexible circuit films are disposed between the outer side surface of the sidewall portion and the side surface cover portion, and an inner side surface of the side surface cover portion directly makes contact with an upper surface of the driving chips.

20. The curved display apparatus of claim 13, wherein the angle increases as a distance from a reference line passing through a center of the curved display panel and parallel to the second direction increases in the first direction.

* * * * *